US008571846B2

(12) United States Patent
Lee et al.

(10) Patent No.: US 8,571,846 B2
(45) Date of Patent: Oct. 29, 2013

(54) ELECTRONIC DEVICE AND METHOD OF GENERATING COMPOSITE ELECTRICAL SIGNALS

(75) Inventors: Cheng-Hsien Lee, Taipei Hsien (TW); Shou-Kuo Hsu, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 428 days.

(21) Appl. No.: 12/978,417

(22) Filed: Dec. 24, 2010

(65) Prior Publication Data

US 2011/0231175 A1    Sep. 22, 2011

(30) Foreign Application Priority Data

Mar. 18, 2010 (TW) ................ 99108069 A

(51) Int. Cl.
   *G06F 17/50* (2006.01)
(52) U.S. Cl.
   USPC .......................................... 703/14; 716/100
(58) Field of Classification Search
   USPC ........................................................ 703/13
   See application file for complete search history.

(56) References Cited

U.S. PATENT DOCUMENTS

| | | | |
|---|---|---|---|
| 6,405,309 B1 * | 6/2002 | Cheng et al. ............. | 713/1 |
| 6,510,405 B1 * | 1/2003 | Gilbertson ................. | 703/16 |
| 6,530,065 B1 * | 3/2003 | McDonald et al. ......... | 716/102 |
| 6,915,249 B1 * | 7/2005 | Sato et al. .................. | 703/14 |
| 7,546,571 B2 * | 6/2009 | Mankin et al. ............. | 716/137 |
| 7,720,662 B1 * | 5/2010 | Aldrich ...................... | 703/13 |
| 7,835,896 B1 * | 11/2010 | Rode .......................... | 703/14 |
| 7,917,347 B2 * | 3/2011 | Aikawa et al. ............. | 703/14 |
| 8,434,068 B2 * | 4/2013 | Wrighton et al. ........... | 717/131 |

OTHER PUBLICATIONS

Lu et al, "A Hierarchical Based Approach for Coupling Aware Delay Analysis of Combinatorial Logic Blocks", IEEE, 2000.*
Solaimalai et al, "Techniques for Embedding Circuit Simulations into Electronic Design Courseware", International Conference on Engineering Education, 2001.*

* cited by examiner

*Primary Examiner* — Mary C Jacob
(74) *Attorney, Agent, or Firm* — Altis & Wispro Law Group, Inc.

(57) ABSTRACT

In an electronic device and a method of generating composite electrical signals, a plurality of post-processing software is installed. An output file, which comprises times and voltages of data points that represent an electrical signal, of an electronic circuit simulation software is loaded, and is read using the installed post-processing software. A time interval of outputs of the electrical signal is obtained by selecting an output type of the electrical signal. The worst bit combination of outputs of the electrical signal is analyzed according to the times, the voltage, and the time interval, and a composite electrical signal is generated according to the worst bit combination.

12 Claims, 5 Drawing Sheets

ELECTRONIC DEVICE AND METHOD OF GENERATING COMPOSITE ELECTRICAL SIGNALS

BACKGROUND

1. Technical Field

Embodiments of the present disclosure generally relate to simulation and analysis of electrical signals, and more particularly to an electronic device and a method of generating composite electrical signals.

2. Description of Related Art

Electronic circuit simulation software uses mathematical models to replicate the behavior of an actual electronic device or circuit to generate an output file. The output file includes times and voltages of data points that represent an electrical signal. Post-processing software analyzes and processes the output file, to generate composite electrical signals using the times and the voltages in the output file.

The output files generated by different electronic circuit simulation software have different formats. For example, the output file generated by the electronic circuit simulation software Allegro PCB SI may be an Allegro format or an HSPICE format. The output file generated by the electronic circuit simulation software ADS may be an ADS format or an HSPICE format. The output file generated by the electronic circuit simulation software SPEED is a SPEED format. However, post-processing software cannot read all formats of output files. Thus, the output file may need to be converted to another format, for being read by the post-processing software. The format conversion of the output file is troublesome.

DETAILED DESCRIPTION

The application is illustrated by way of examples and not by way of limitation in the figures of the accompanying drawings in which like references indicate similar elements. It should be noted that references to "an" or "one" embodiment in this disclosure are not necessarily to the same embodiment, and such references mean at least one.

In general, the word "module" as used hereinafter, refers to logic embodied in hardware or firmware, or to a collection of software instructions, written in a programming language, such as, for example, Java, C, or Assembly. One or more software instructions in the modules may be embedded in firmware. It will be appreciated that modules may be comprised of connected logic units, such as gates and flip-flops, and may be comprised of programmable units, such as programmable gate arrays or processors. The modules described herein may be implemented as either software and/or hardware modules and may be stored in any type of computer-readable medium or other computer storage device.

Figure 1:
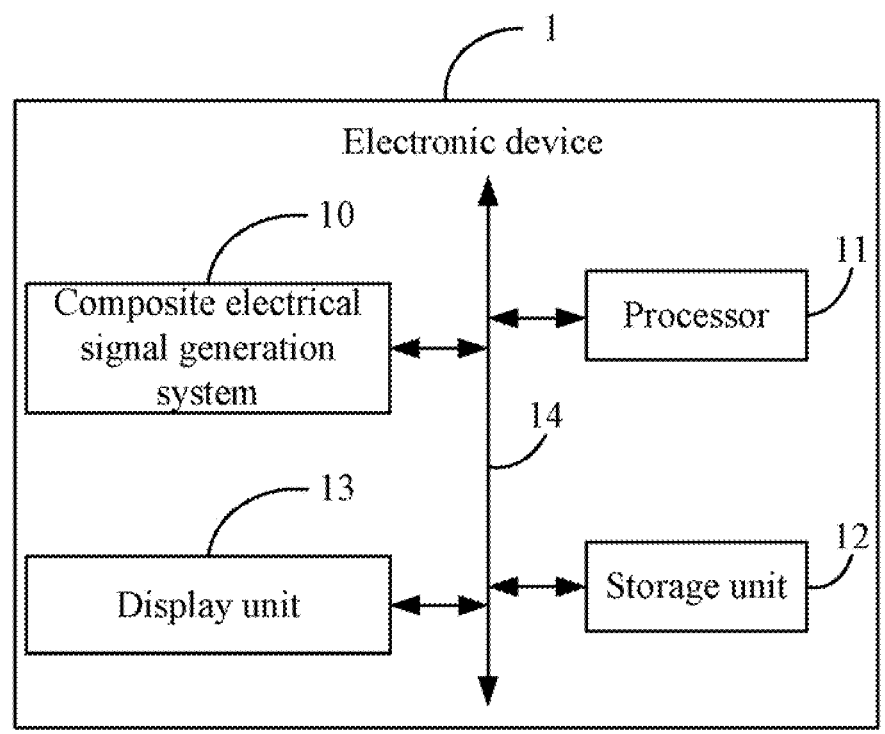
FIG. 1 is a block diagram of an electronic device, according to some embodiments of the present disclosure.

FIG. 1 is a block diagram of an electronic device 1, according to some embodiments of the present disclosure. The electronic device 1 includes components of a composite electrical signal generation system 10, a processor 11, a storage unit 12, and a display unit 13. These components 10~13 communicate over one or more communication buses or signal lines. The electronic device 1 can be any electronic device, including but not limited to a computer, a server, or a personal digital assistant (PDA), for example. It should be appreciated that the electronic device 1 may have more or fewer components than shown in FIG. 1, or a different configuration of components. The various components shown in FIG. 1 may be implemented in hardware, software or a combination thereof, including one or more signal processing and/or application specific integrated circuit.

The composite electrical signal generation system 10 includes a plurality of function modules (see below descriptions referring to FIG. 2), to generate composite electrical signals.

The function modules of the composite electrical signal generation system 10 may include one or more computerized codes in the form of one or more programs that are stored in the storage unit 12. The storage unit 12 may include high speed random access memory and may also include non-volatile memory, such as one or more magnetic disk storage devices, flash memory devices, or other non-volatile solid state memory devices. The one or more computerized codes of the composite electrical signal generation system 10 includes instructions that are executed by the processor 11, to provide functions for the function modules of the composite electrical signal generation system 10.

Figure 2:
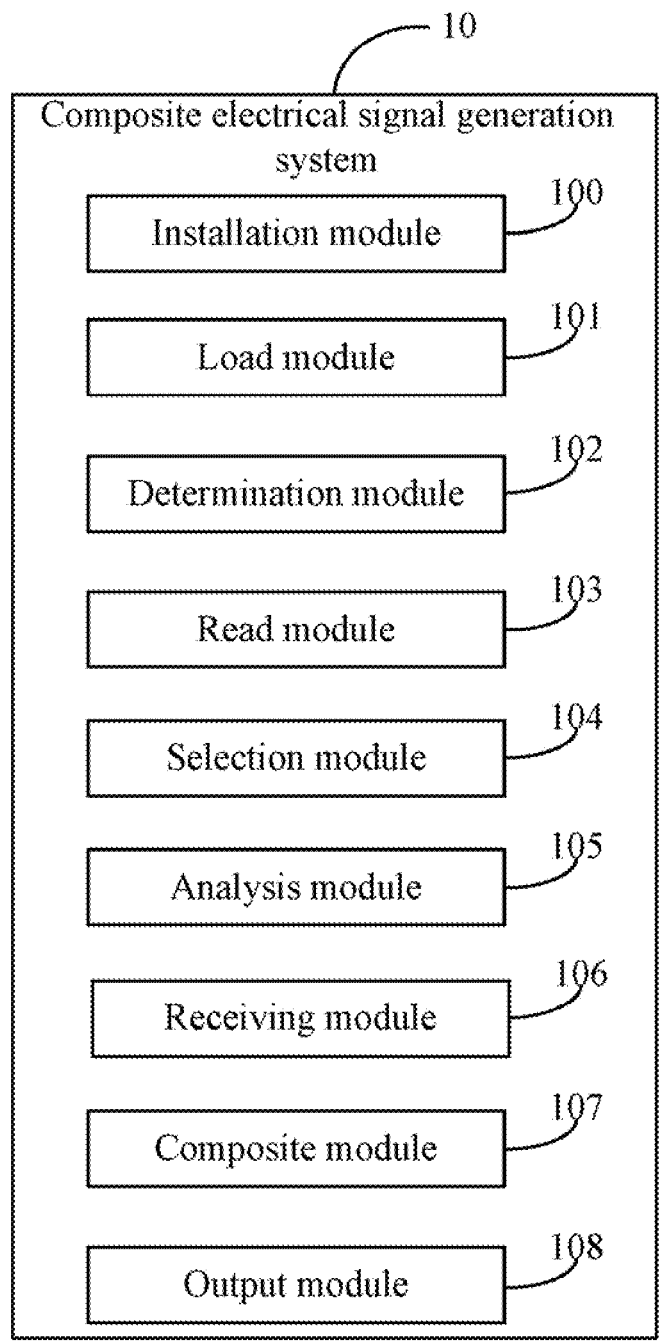
FIG. 2 is a block diagram illustrating function modules of a composite electrical signal generation system included in the electronic device of FIG. 1, according to some embodiments of the present disclosure.

FIG. 2 is a block diagram illustrating the function modules of the composite electrical signal generation system 10, according to some embodiments of the present disclosure. The function modules of the composite electrical signal generation system 10 may include an installation module 100, a load module 101, a determination module 102, a read module 103, a selection module 104, an analysis module 105, a receiving module 106, a composite module 107, and an output module 108.

The installation module 100 installs a plurality of post-processing software into the electronic device 1. As mentioned above, the post-processing software can analyze and process output files of electronic circuit simulation software.

The load module 101 loads an output file of electronic circuit simulation software. The output file includes times and voltages of data points that represent an electrical signal. The output file may be an Allegro format, an HSPICE format, an ADS format, or a SPEED format.

The determination module 102 determines a format of the output file, and determines whether one of the installed post-processing software is able to read the output file according to the format of the output file, and informs the installation module 100 to install a new post-processing software, which is able to read the output file, into the electronic device 1 if none of the installed post-processing software is able to read the output file.

The read module 103 reads the times and voltages of the data points that represent the electrical signal from the output file using the installed post-processing software.

The selection module 104 selects an output type of the electrical signal to obtain a time interval of outputs of the electrical signal. The output type may be a peripheral component interconnect (PCI) electrical signal type or a universal serial bus (USB) electrical signal type, for example.

Figure 3A:
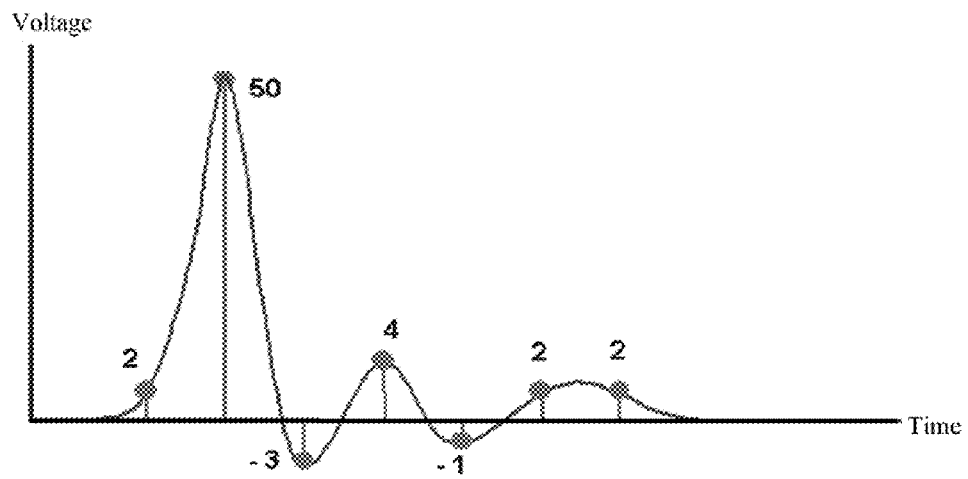
FIG. 3A-3B are examples of an electrical signal and a bit combination of outputs of the electrical signal.
Figure 3B:
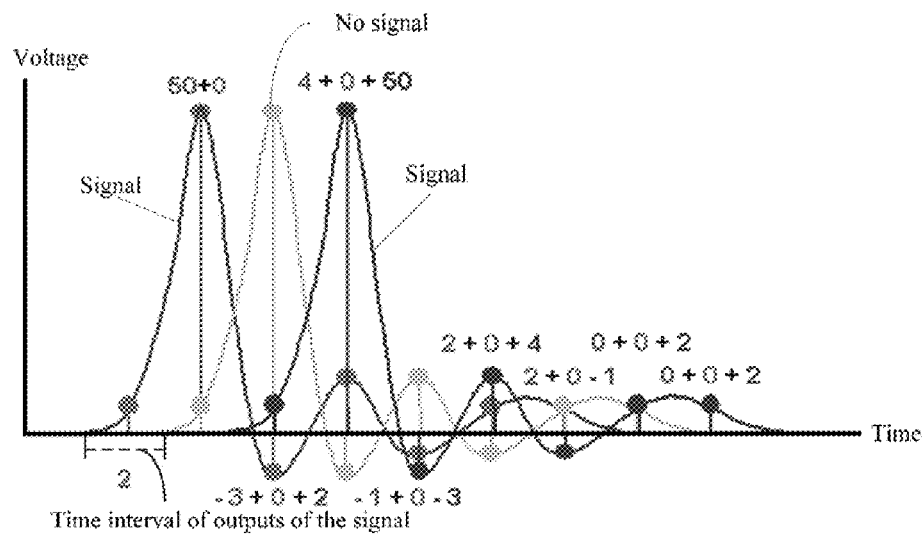

The analysis module 105 analyzes the worst bit combination of outputs of the electrical signal according to the times, the voltage, and the time interval of the electrical signal. A bit combination of outputs of the electrical signal means a combination of at least one "0" and at least one "1". "0" indicates no output of the electrical signal after the time interval, and "1" indicates an output of the electrical signal after the time interval, during a time period. Because superposition of the electrical signal, each bit combination of outputs of the electrical signal may generate a composite electrical signal. The worst bit combination is the bit combination which makes a peak value of the generated composite electrical signal minimum. Referring to FIG. 3A, an electrical signal is represented by data points of times and voltages. Referring to FIG. 3B, a bit combination "101" of outputs of the electrical signal is illustrated. From FIG. 3B, it may be seen that, the peak value of the composite electrical signal which is generated according to the bit combination "101" is 4+0+50, namely 54.

The receiving module 106 receives one or more bit combinations inputted by a user.

Figure 4:
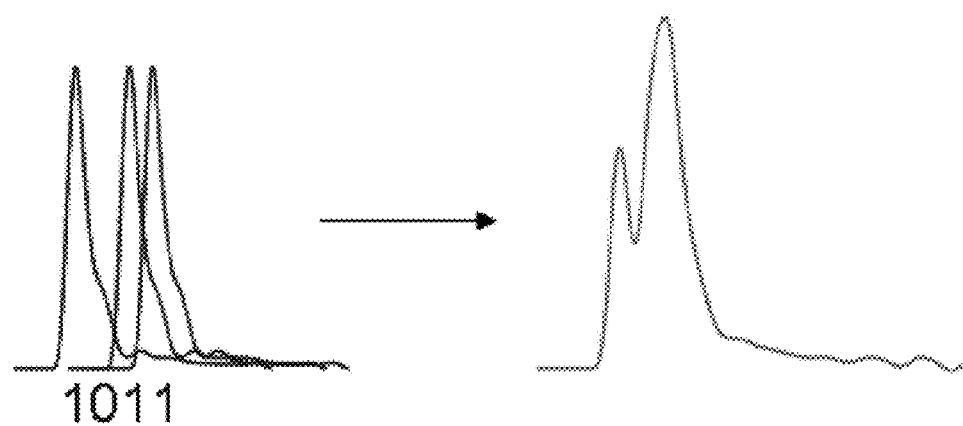
FIG. 4 illustrates a composite electrical signal.

The composite module 107 generates composite electrical signals according to the worst bit combination or the one or more bit combinations inputted by the user. FIG. 4 illustrates a composite electrical signal generated according to a bit combination "1011" of outputs of an electrical signal.

The output module 108 outputs the generated composite electrical signals on the display unit 13 of the electronic device 1.

Figure 5:
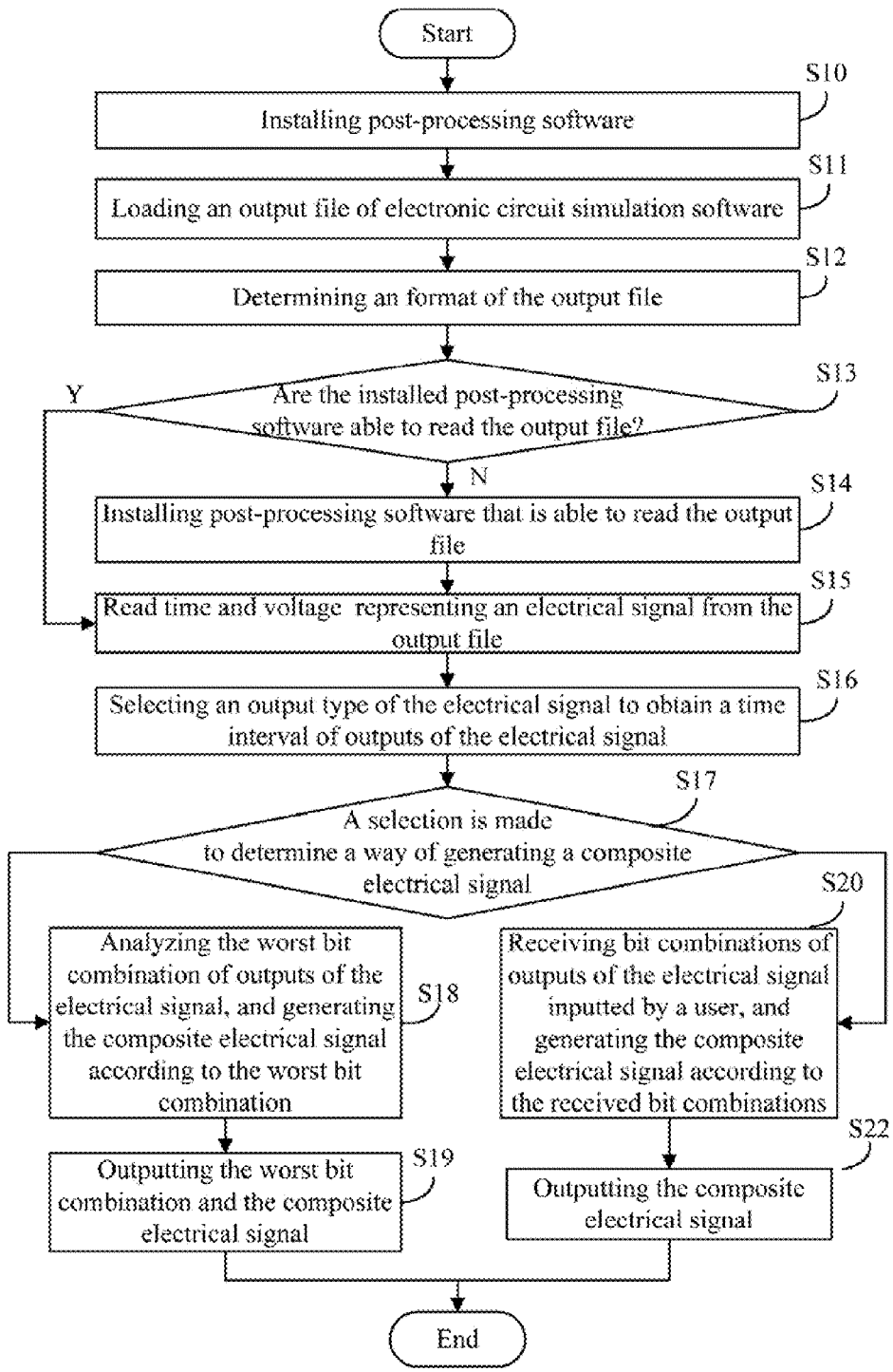
FIG. 5 is a flowchart of a method of generating composite electrical signals, according to some embodiments of the present disclosure.

FIG. 5 is a flowchart of a method of generating composite electrical signals, according to some embodiments of the present disclosure. The method being performed by execution of computer readable program code by the processor 11 of the electronic device 1. Depending on the embodiment, additional blocks in the flow of FIG. 5 may be added, others removed, and the ordering of the blocks may be changed.

In block S10, the installation module 100 installs a plurality of post-processing software into the electronic device 1.

In block S11, the load module 101 loads an output file of electronic circuit simulation software. The output files include times and voltages of data points that represent an electrical signal. The output file may be an Allegro format, an HSPICE format, an ADS format, or a SPEED format.

In block S12, the determination module 102 determines a format of the output file, and in block S13, the determination module 102 further determines whether one of the installed post-processing software is able to read the output file according to the format of the output file. Block S14 is implemented to install a new post-processing software that is able to read the output file into the electronic device 1, if none of the installed post-processing software is able to read the output file. Otherwise, block S15 is implemented if one of the installed post-processing software is able to read the output file.

In block S15, the read module 103 reads the times and voltages of the data points that represent the electrical signal from the output file using the installed post-processing software.

In block S16, the selection module 104 selects an output type of the electrical signal to obtain a time interval of outputs of the electrical signal. The output type may be a PCI electrical signal type or a USB electrical signal type, for example.

In block S17, a selection is made by a user to determine a way of generating composite electrical signals. The way of generating composite electrical signals may be according to the worst bit combination of outputs of the electrical signal, or according to one or more bit combinations inputted by a user. Blocks S18 and S19 are implemented if the composite electrical signal is generated according to the worst bit combination. Otherwise, blocks S20 and S21 are implemented if the composite electrical signal is generated according to one or more bit combinations inputted by the user.

In block S18, the analysis module 105 analyzes the worst bit combination of outputs of the electrical signal according to the times, the voltage, and the time interval, and the composite module 107 generates a composite electrical signal according to the worst bit combination. In block S19, the output module 108 outputs the worst bit combination and the generated composite electrical signals on the display unit 13 of the electronic device 1.

In block S20, the receiving module 106 receives one or more bit combinations inputted by the user, and the composite module 107 generates composite electrical signals according to the one or more bit combinations inputted by the user. In block S21, the output module 108 outputs the generated composite electrical signals on the display unit 13 of the electronic device 1.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A method of generating composite electrical signals, comprising:
   (a) installing a plurality of post-processing software into an electronic device;
   (b) loading an output file of an electronic circuit simulation software, wherein the output file comprises times and voltages of data points that represent an electrical signal;
   (c) determining whether one of the installed post-processing software is able to read the output file according to a format of the output file;
   (d) installing a new post-processing software that is able to read the output file into the electronic device, upon the condition that none of the installed post-processing software is able to read the output file;
   (e) reading the times and the voltages of the data points that represent the electrical signal from the output file using the installed post-processing software;
   (f) selecting an output type of the electrical signal to obtain a time interval of outputs of the electrical signal;
   (g) analyzing a worst bit combination of outputs of the electrical signal according to the times, the voltage, and the time interval, and generating a composite electrical signal according to the worst bit combination; and
   (h) outputting the worst bit combination and a generated composite electrical signal on a display unit of the electronic device.

2. The method as described in claim 1, wherein the format of the output file is one of an Allegro format, an HSPICE format, an ADS format, and a SPEED format.

3. The method as described in claim 1, wherein the output type of the electrical signal is a PCI electrical signal type or a USB electrical signal type.

4. The method as described in claim 1, after (f) further comprising:
   receiving one or more bit combinations of outputs of the electrical signal inputted by a user; and
   generating composite electrical signals according to the one or more bit combinations inputted by the user.

5. A non-transitory storage medium having stored thereon instructions that, when executed by a processor, cause the processor to perform a method of generating composite electrical signals, comprising:

(a) installing a plurality of post-processing software into an electronic device;
(b) loading an output file of electronic circuit simulation software, wherein the output files comprises times and voltages of data points that represent an electrical signal;
(c) determining whether one of the installed post-processing software is able to read the output file according to a format of the output file;
(d) installing a new post-processing software that is able to read the output file into the electronic device, upon the condition that none of the installed post-processing software is able to read the output file;
(e) reading the times and the voltages of the data points that represent the electrical signal from the output file using the installed post-processing software;
(f) selecting an output type of the electrical signal to obtain a time interval of outputs of the electrical signal;
(g) analyzing a worst bit combination of outputs of the electrical signal according to the times, the voltage, and the time interval, and generating a composite electrical signal according to the worst bit combination; and
(h) outputting the worst bit combination and a generated composite electrical signal on a display unit of the electronic device.

6. The non-transitory storage medium as described in claim 5, wherein the format of the output file is one of an Allegro format, an HSPICE format, an ADS format, or a SPEED format.

7. The non-transitory storage medium as described in claim 5, wherein the output type of the electrical signal is a PCI electrical signal type or a USB electrical signal type.

8. The non-transitory storage medium as described in claim 5, after (f) further comprising:
receiving one or more bit combinations of outputs of the electrical signal inputted by a user; and
generating composite electrical signals according to the one or more bit combinations inputted by the user.

9. An electronic device, comprising:
at least one processor;
storage unit;
a display unit;
one or more programs that are stored in the storage unit and are executed by the at least one processor, the one or more programs comprising:
an installation module to install a plurality of post-processing software into the electronic device;
a load module to load an output file of electronic circuit simulation software, wherein the output file includes times and voltages of data points that represent an electrical signal;
a determination module to determine a format of the output file, determine whether one of the installed post-processing software is able to read the output file according to the format of the output file, and inform the installation module to install a new post-processing software that is able to read the output file into the electronic device, upon the condition that none of the installed post-processing software is able to read the output file;
a read module to read the times and the voltages of the data points that represent the electrical signal from the output file using the installed post-processing software;
a selection module to select an output type of the electrical signal to obtain a time interval of outputs of the electrical signal;
an analysis module to analyze a worst bit combination of outputs of the electrical signal according to the times, the voltage, and the time interval;
a composite module to generate a composite electrical signal according to the worst bit combination; and
an output module to output the worst bit combination and a generated composite electrical signal on the display unit.

10. The electronic device as described in claim 9, wherein the format of the output file is one of an Allegro format, an HSPICE format, an ADS format, or a SPEED format.

11. The electronic device as described in claim 9, wherein the output type of the electrical signal is a PCI electrical signal type or a USB electrical signal type.

12. The electronic device as described in claim 9, further comprising:
a receiving module to receive one or more bit combinations of outputs of the electrical signal inputted by a user; and
the composite module to generate composite electrical signals according to the one or more bit combinations inputted by the user.

* * * * *